(12) United States Patent
Chu et al.

(10) Patent No.: US 6,285,225 B1
(45) Date of Patent: Sep. 4, 2001

(54) DELAY LOCKED LOOP CIRCUITS AND METHODS OF OPERATION THEREOF

(75) Inventors: Yong-gyu Chu; Jae-hyeong Lee, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/361,022

(22) Filed: Jul. 23, 1999

(30) Foreign Application Priority Data

Aug. 8, 1998 (KR) .................................................. 98-32293

(51) Int. Cl.[7] .............................. H03L 7/06; H03K 5/159
(52) U.S. Cl. ................................. 327/158; 327/149; 327/3
(58) Field of Search ................................. 327/544, 158, 327/149, 236, 237, 270, 3

(56) References Cited

U.S. PATENT DOCUMENTS

| | | | |
|---|---|---|---|
| 5,220,206 | * 6/1993 | Tsang et al. | 327/544 |
| 5,684,421 | * 11/1997 | Chapman et al. | 327/158 |
| 5,717,353 | * 2/1998 | Fujimoto | 327/276 |
| 5,880,612 | * 3/1999 | Kim | 327/158 |
| 6,157,229 | * 12/2000 | Yoshikawa | 327/149 |

FOREIGN PATENT DOCUMENTS

HEI 8-97714   4/1996   (JP) .

OTHER PUBLICATIONS

Notice to Submit Response, Korean Application No. 10–1998–0032293, Aug. 26, 2000.

* cited by examiner

*Primary Examiner*—Dinh T. Le
(74) *Attorney, Agent, or Firm*—Myers Bigel Sibley & Sajovec (57) ABSTRACT

A delay locked loop circuit includes a variable delay circuit that receives an input clock signal and produces a delayed clock signal that is variably delayed with respect to the input clock signal responsive to a delay control signal applied to the variable delay circuit. A delay control circuit is responsive to the input clock signal and to the delayed clock signal, and applies a delay control signal to the variable delay circuit based on a comparison of an edge of the delayed clock signal corresponding to a first edge of the input clock signal to a second edge of the input clock signal that follows the first edge of the input clock signal. In an embodiment, the delay control circuit includes a phase comparator circuit that receives the input clock signal and the delayed clock signal and produces a phase comparison signal that indicates whether the edge of the delayed clock signal corresponding to the first edge of the reference clock signal leads or lags the second edge of the input clock signal. A delay control signal generating circuit applies a delay control signal to the variable delay circuit responsive to the phase comparison signal. Related operating methods also are provided.

20 Claims, 5 Drawing Sheets

DELAY LOCKED LOOP CIRCUITS AND METHODS OF OPERATION THEREOF

FIELD OF THE INVENTION

The present invention relates to integrated circuit devices and methods of operation thereof, and more particularly, to apparatus and methods for synchronizing clock signals in integrated circuit devices.

BACKGROUND OF THE INVENTION

Integrated circuit devices such as microprocessors and peripheral circuits typically operate in a synchronized fashion at very high speeds. For example, in systems including several kinds of integrated circuit devices, each device commonly operates in synchronization with a clock signal provided to the device. Thus, such a system often includes one or more circuits for generating clock signals synchronized to a reference clock signal, such as a phase-locked loop (PLL) circuit that generates an output clock signal having the same phase as an input reference clock signal using a voltage controlled oscillator.

In some applications, however, the use of such PLL circuits may be disadvantageous, as lags associated with control of the voltage controlled oscillator may cause such a PLL circuit to take a significant time to generate an output clock signal having the same phase as the reference clock signal. These control lags may also result in undesirably high power consumption.

The use of delay locked loop (DLL) circuits has been proposed to avoid such problems. A typically DLL circuit generates a delayed clock signal from a reference clock signal, with the delayed clock signal typically being used as a reference signal for operation of devices. A typically DLL circuit uses a phase comparator to compare the phase of the reference clock signal with that of the delayed clock signal, and feeds back the comparison result to a delay controller that varies the delay of the delayed clock signal.

Conventional DLL circuits typically use a phase comparator similar to that used in PLL circuits. However, using such a phase comparator may be disadvantageous for operation of a DLL circuit. The output clock signal produced by a PLL typically is not a signal delayed from a reference clock signal, but rather a signal produced by a voltage controlled oscillator. Consequently, at arbitrary times, the output clock signal produced by the voltage controlled oscillator of a PLL may be synchronous with a pulse of a reference clock signal.

In contrast, the DLL delays an input reference clock signal to generate a delay clock signal, which generally imposes causality constraints on the operation of the phase comparator. For example, a DLL circuit may malfunction if its phase comparator attempts to synchronize a kth pulse of the reference clock signal with a corresponding pulse of the delayed clock signal produced from the kth pulse of the reference clock signal, as the delay circuit of the DLL generally cannot sufficiently advance the delayed clock signal to provide synchronization.

SUMMARY OF THE INVENTION

In light of the foregoing, it is an object of the present invention to provide delay locked loop circuits which may provide improved performance and methods of operation therefor.

It is another object of the present invention to provide phase comparator circuits for use in delay locked loops which may provide improved performance.

These and other objects, features and advantages are provided, according to embodiments of the present invention, by delay locked loop circuits in which a delayed clock signal is produced from an input clock signal by a variable delay circuit that varies the delay of the delayed clock signal responsive to a comparison of an edge of the delayed clock signal corresponding to a first edge of the input clock signal to a second edge of the input clock signal that follows the first edge. In embodiments of the present invention, a delay locked loop circuit includes a phase comparator circuit that asserts first and second phase comparison signals depending on whether an edge of the delayed clock signal corresponding to a first edge of the input clock signal leads or lags a second edge of the input clock signal that follows the first edge of the input clock signal.

In particular, according to an embodiment of the present invention, a delay locked loop circuit includes a variable delay circuit that receives an input clock signal and produces a delayed clock signal that is variably delayed with respect to the input clock signal responsive to a delay control signal applied to the variable delay circuit. A delay control circuit is responsive to the input clock signal and to the delayed clock signal, and applies a delay control signal to the variable delay circuit based on a comparison of a transition of the delayed clock signal corresponding to a first transition of the input clock signal to a second transition of the input clock signal that follows the first transition of the input clock signal. In preferred embodiments, the delay control circuit generates the delay control signal based on a comparison of an edge of the delayed clock signal corresponding to a first edge of the input clock signal to a second edge of the input clock signal that follows the first edge of the input clock signal.

In an embodiment of the present invention, the delay control circuit includes a phase comparator circuit that receives an input clock signal and a delayed clock signal produced therefrom, and produces a phase comparison signal that indicates whether the edge of the delayed clock signal corresponding to the first edge of the input clock signal leads or lags the second edge of the input clock signal. A delay control signal generating circuit applies a delay control signal to the variable delay circuit responsive to the phase comparison signal.

Preferably, the phase comparator circuit asserts a first phase comparison signal if the edge of the delayed clock signal corresponding to the first edge of the input clock signal lags the second edge of the input clock signal, and asserts a second phase comparison signal if the edge of the delayed clock signal corresponding to the first edge of the input clock signal leads the second edge of the input clock signal. The delay control signal generating circuit may generate the delay control signal responsive to the first and second phase comparison signals.

According to another embodiment of the present invention, the delay control signal generating circuit includes a charge pump that generates a delay control signal responsive to at least one phase comparison signal. In one embodiment of the present invention, the charge pump includes a capacitor, a current source, and a current sink. A first switch is operative to couple the current source to the capacitor when a first one of first and second phase comparison signals is asserted. A second switch is operative to couple the current sink to the capacitor when an edge of the input clock signal lags the second edge of the input clock signal.

According to another embodiment of the present invention, the phase comparator circuit includes a first flip-flop having a data input, a clock input, a reset input and an output. The first flip-flop receives the input clock signal at the clock input and a first data signal at the data input, clocking the first data signal to produce a second data signal at the output responsive to an edge of the input clock signal and resetting the second data signal responsive to an initialization signal at the reset input. A second flip-flop having a clock input, a data input, a reset input and an output receives the delayed clock signal at the clock input and the first data signal at the input. The second flip-flop clocks the first data signal to produce the second phase comparison signal at the output of the second flip-flop responsive to an edge of the delayed clock signal, and resets the second phase comparison signal responsive to a reset signal at the reset input. A third flip-flop having a clock input, a data input connected to the output of the first flip-flop, a reset input, and an output, clocks the second data signal to produce the first phase comparison signal at the output of the third flip-flop responsive to an edge of the input clock signal, and resets the first phase comparison signal responsive to a reset signal at the reset input. A reset circuit is coupled to the outputs of the second and third flip-flops and is operative to apply a reset signal to the reset inputs of the second and third flip-flops responsive to at least one of the first and second phase comparison signals or the initialization signal.

According to method aspects of the present invention, a delayed signal (e.g., a delayed clock signal) is synchronized to a periodic input signal (e.g., a reference clock signal) from which it is generated. A delayed signal is generated from the periodic input signal. A determination is made as to whether a feature of the delayed signal corresponding to a first feature of the periodic input signal leads or lags a second feature of the periodic input signal that follows the first feature of the periodic input signal. The delay of the delayed signal with respect to the periodic input signal is varied based on the determination of whether a feature of the delayed signal corresponding to the first feature of the periodic input signal leads or lags the second feature of the periodic input signal.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1:
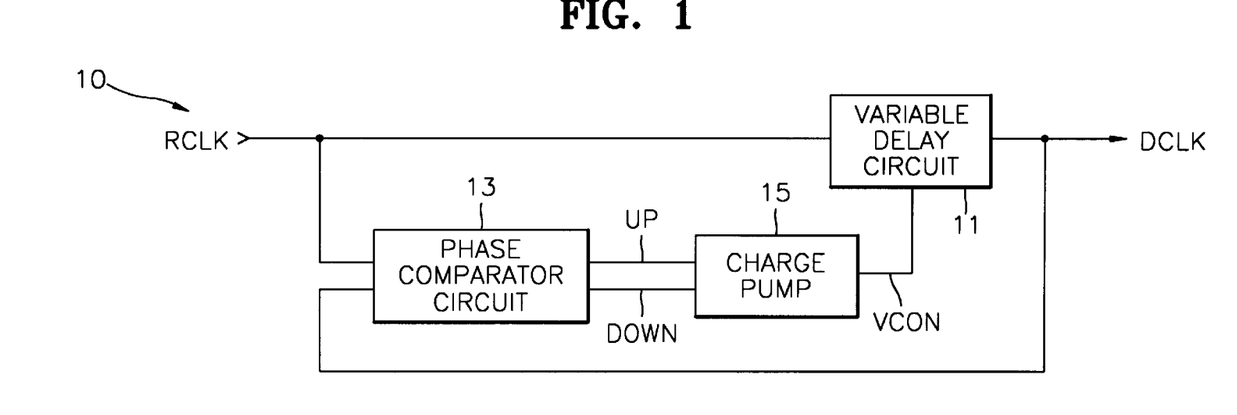
FIG. 1 is a schematic diagram illustrating a delay locked loop according to an embodiment of the present invention.

Referring to FIG. 1, a delay locked loop (DLL) circuit 10 according to one embodiment of the present invention includes a variable delay circuit 11, a phase comparator circuit 13 and a charge pump 15. The variable delay circuit 11 produces a delayed clock signal DCLK from a reference clock signal RCLK. The delayed clock signal DCLK is delayed with respect to the reference clock signal RCLK by a variable time interval controlled by a control signal VCON produced by the charge pump 15.

The phase comparator circuit 13 compares the phase of a pulse of the delayed clock signal DCLK corresponding to a kth pulse of the reference clock signal RCLK with the phase of a subsequent (k+i)th pulse (where k and i are integers) of the reference clock signal RCLK, asserting either a first phase comparison signal DOWN or a second phase comparison signal UP depending on the phase relationship of the compared signals. Specifically, the phase comparator circuit 13 asserts the first phase comparison signal DOWN when the pulse of the delay clock signal DCLK corresponding to the kth pulse of the reference clock signal RCLK leads the (k+i)th pulse of the reference clock signal RCLK, and asserts the second phase comparison signal UP when the pulse of the delay clock signal DCLK corresponding to the kth pulse of the reference clock signal RCLK lags the (k+i)th pulse of the reference clock signal RCLK.

The charge pump 15 receives the first and second phase comparison signals DOWN, UP and generates the delay control signal VCON responsively thereto. In one embodiment of the present invention, the voltage of the delay control signal VCON varies based on a ratio of the duty cycles of the first and second phase comparison signals DOWN, UP.

Figure 2:
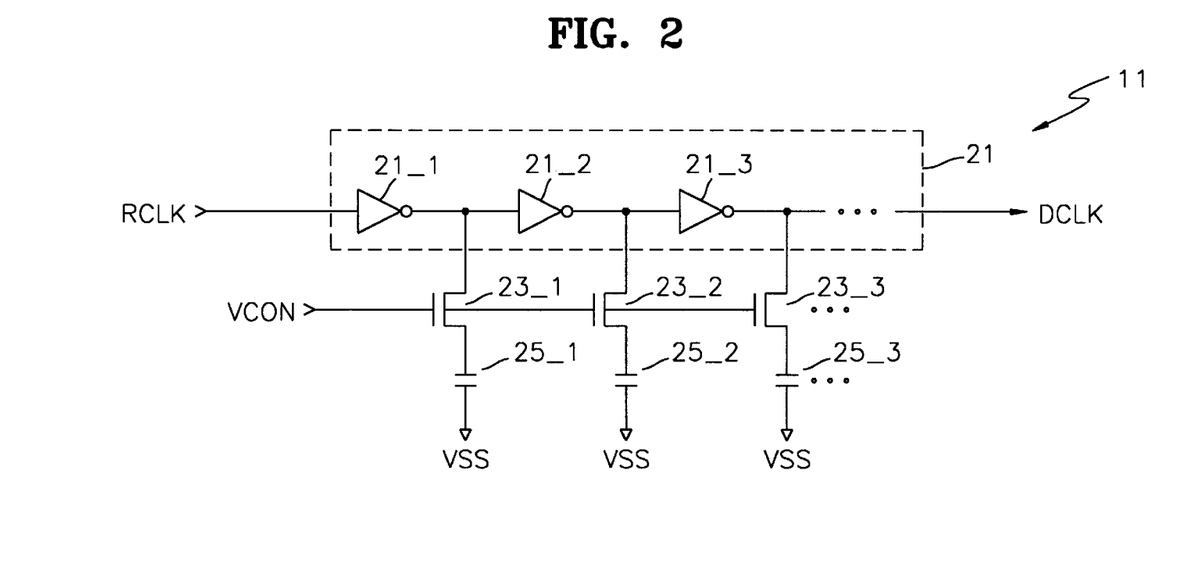
FIG. 2 is a schematic diagram illustrating a variable delay circuit according to an embodiment of the present invention.

FIG. 2 illustrates a variable delay circuit 11 according to an embodiment of the present invention. The variable delay circuit 11 includes a series-coupled plurality of inverters 21-1, 21-2, 21-3, . . . , that form a delay line circuit. Respective capacitors 25-1, 25-2, 25-3, . . . , are connected to a signal ground VSS, and to respective outputs of the inverters 21-1, 21-2, 21-3, . . . , by respective switches (e.g., NMOS transistors) 23-1,23-2,23-3, . . . , that are responsive to the delay control signal VCON. The switches 23-1, 23-2, 23-3, . . . act to vary the impedance between the inverters 21-1, 21-2,21-3, . . . , and the capacitors 25-1, 25-2,25-3, . . . , thus varying the delay of the delayed clock signal DCLK with respect to the reference clock signal RCLK. The higher the voltage of the control signal VCON is, the longer the delay between the delayed clock DCLK and the reference clock RCLK.

Figure 3:
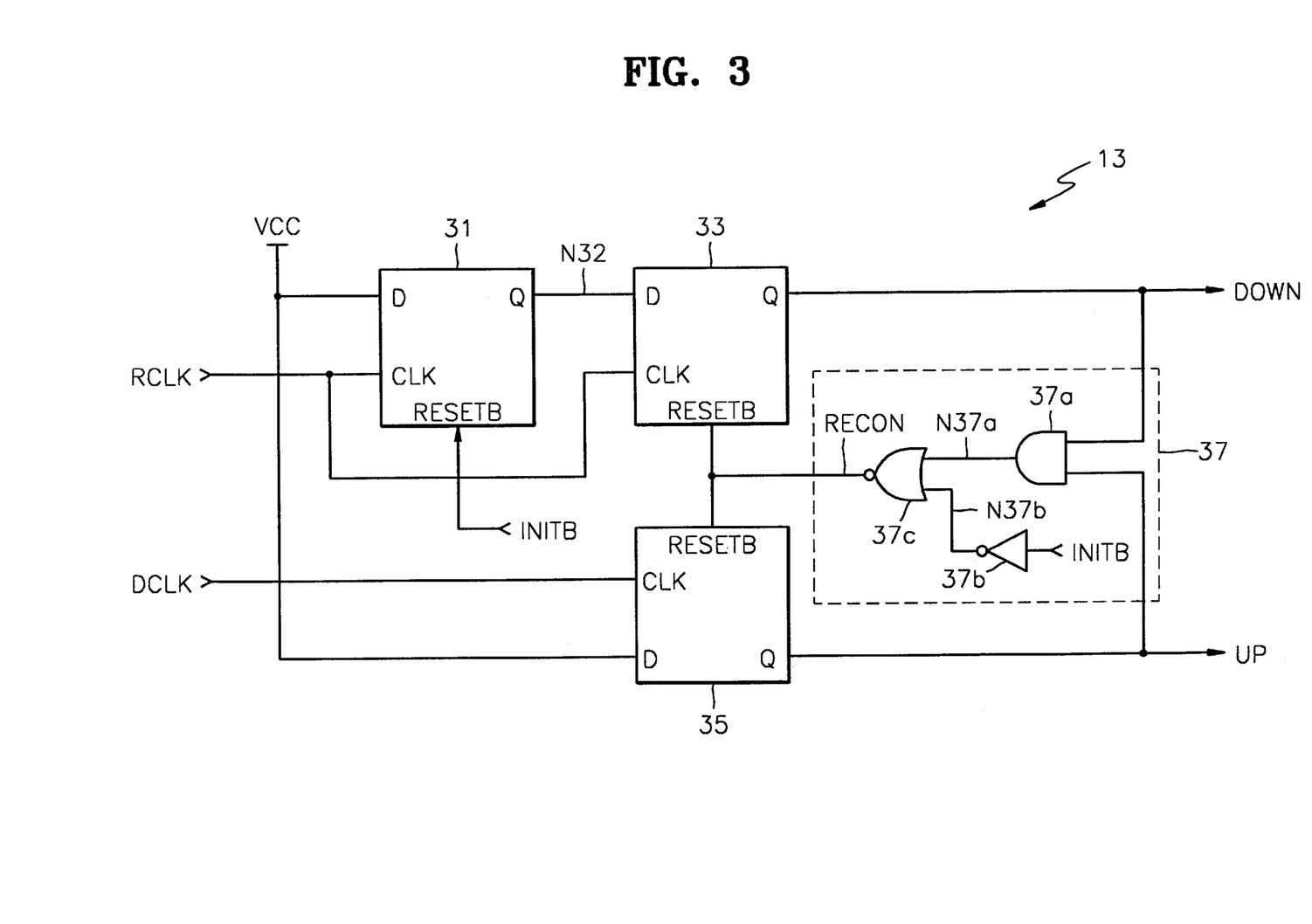
FIG. 3 is a circuit diagram of a phase comparator circuit according to an embodiment of the present invention.

FIG. 3 illustrates a phase comparator circuit 13 according to an embodiment of the present invention. The phase comparator 13 compares the phase of a rising edge of the delayed clock signal DCLK corresponding to a rising edge of a kth pulse of the reference clock signal RCLK with the phase of a rising edge of a (k+i)th pulse of the reference clock signal RCLK, with i preferably equal to 1.

The phase comparator circuit 13 includes first, second and third flip-flops 31, 33 and 35 (preferably D flip-flops), and a logic circuit 37. A data (logic) signal in the form of a power supply voltage VCC is applied to a data input D of the first flip-flop 31. The reference clock signal RCLK is applied to a clock input of the first flip-flop 31. An initialization signal INITB is applied to a reset input of the first flip-flop 31. The initializing signal INITB is driven low to initialize the phase comparator circuit 13, and then is taken high to allow control of generation of the delayed clock signal DCLK.

An output signal N32 produced by the first flip-flop 31 is applied to a data input D of the second flip-flop 33, and the reference clock signal RCLK is applied to a clock input CLK of the second flip-flop 33. A reset signal RECON produced by the logic circuit 37 is applied to a reset input RESETB of the second flip-flop 33. The second flip-flop 33 produces the first phase comparison signal DOWN responsive to these inputs.

The power supply voltage VCC is also applied to a data input D of the third flip-flop 35, and the delay clock signal DCLK is applied to a clock input CLK of the third flip-flop 35. The reset signal RECON produced by the logic circuit 37 is applied to a reset input RESETB of the third flip-flop 35. The third flip-flop 35 produces the second phase comparison signal UP responsive to these inputs.

The logic circuit 37 includes an AND gate 37a, an inverter 37b and a NOR gate 37c. The AND gate 37a logically ANDs the first phase comparison signal DOWN and the second phase comparison signal UP, generating a logic signal N37a that is applied to the NOR gate 37c. The inverter 37b inverts the initializing signal INITB, producing a logic signal N37b that is applied to the NOR gate 37c. The reset signal RECON is produced responsive to the logic signals N37a, N37b applied to the NOR gate 37c.

Figure 4:
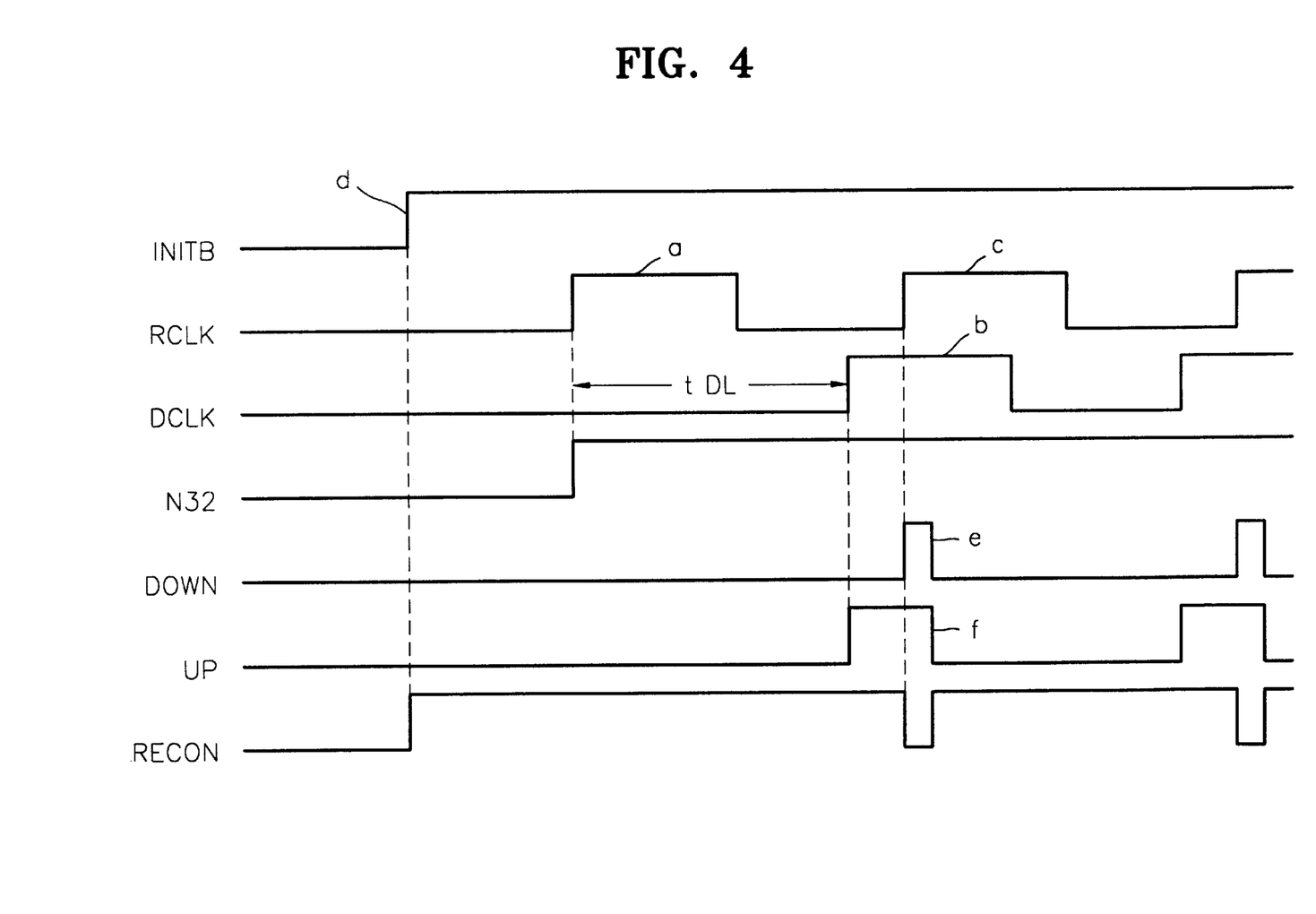
FIGS. 4–5 are timing diagrams illustrating exemplary operations of a delayed lock loop according to embodiments of the present invention.
Figure 5:
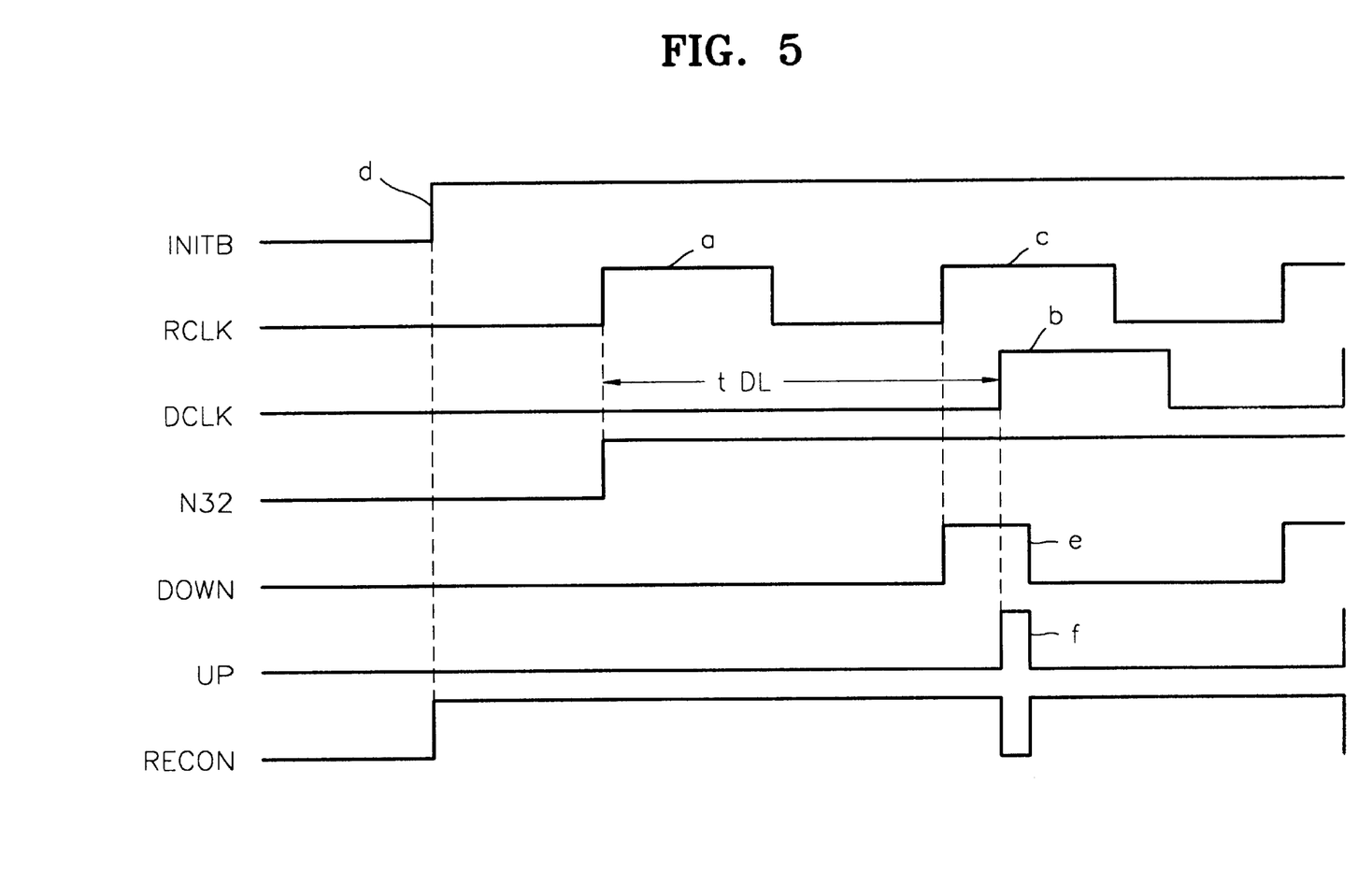

FIG. 4 is a timing diagram illustrating exemplary operations of the phase comparator circuit 13 of FIGS. 1 and 3 in a case where an edge of the delayed clock signal DCLK corresponding to an edge of a kth pulse of the reference clock RCLK leads the phase of an edge of the (k+l)th pulse of the reference clock signal RCLK. FIG. 5 is a timing diagram illustrating exemplary operations of the phase comparator 13 when an edge of the delayed clock signal DCLK corresponding to an edge of a kth pulse of the reference clock signal lags the phase of an edge of a (k+l)th pulse of the reference clock signal RCLK.

In FIG. 4, the delay time tDL introduced by the delay circuit 11 is less than the period of the reference clock signal RCLK. Initially, the initialization signal INITB is held low, driving the reset signal RECON to a logic low state and resetting the flip-flops 31, 33, 35 of the phase comparator circuit 13. After de-assertion of the initialization signal INITB to a logic high state at point d (which also takes the reset signal RECON to a logic high state), a kth pulse a appears on the reference clock signal, driving the logic signal N32 high. A subsequently occurring pulse b of the delayed clock signal DCLK corresponds to the kth pulse a of the reference clock signal RCLK. The rising edge of the pulse b leads the rising edge of a (k+l)th pulse c of the reference clock signal RCLK.

For the time period during the pulse b in which the delayed clock signal DCLK is high and the reference clock signal RCLK is low, the second phase comparison signal UP is driven high. Upon the next rising edge of the reference clock signal, i.e., the rising edge of the pulse c, the first phase comparison signal DOWN is momentarily driven high, driving the reset signal RECON low and resetting the second and third flip-flops 33, 35 such that the first and second phase comparison signals UP, DOWN are both driven to a low state. Thus, when the rising edge of the pulse b of delayed clock signal DCLK corresponding to the kth pulse a of the reference clock signal RCLK leads the rising edge of the (k+l)th pulse c of the clock signal RCLK, the second phase comparison signal UP has a higher duty cycle than the first phase comparison signal DOWN, as indicated by the differences in the widths of pulses e, f.

Referring now to FIG. 5, when the rising edge of the pulse b of delayed clock signal DCLK corresponding to the kth pulse a of the reference clock signal RCLK lags the rising edge of the (k+l)th pulse c of the clock signal RCLK, the first phase comparison signal UP has a lower duty cycle than the first phase comparison signal DOWN, as indicated by the differences in the widths of pulses e, f. As illustrated, because the rising edge of the pulse c of the reference clock signal RCLK occurs before the rising edge of the pulse b of the delayed clock signal DCLK, a logic high is first clocked to the output of the second flip-flop 33, causing the first phase comparison signal to go to a logic high state for the time period extending from the rising edge of the pulse c of the reference clock signal to the rising edge of the pulse b of the delayed clock signal. Responsive to the rising edge of the pulse b of the delayed clock signal DCLK, the second phase comparison signal UP also momentarily goes high, driving the reset signal RECON low, resetting the flip-flops 33,35 and sending the first and second phase comparison signals DOWN, UP low again.

Figure 6:
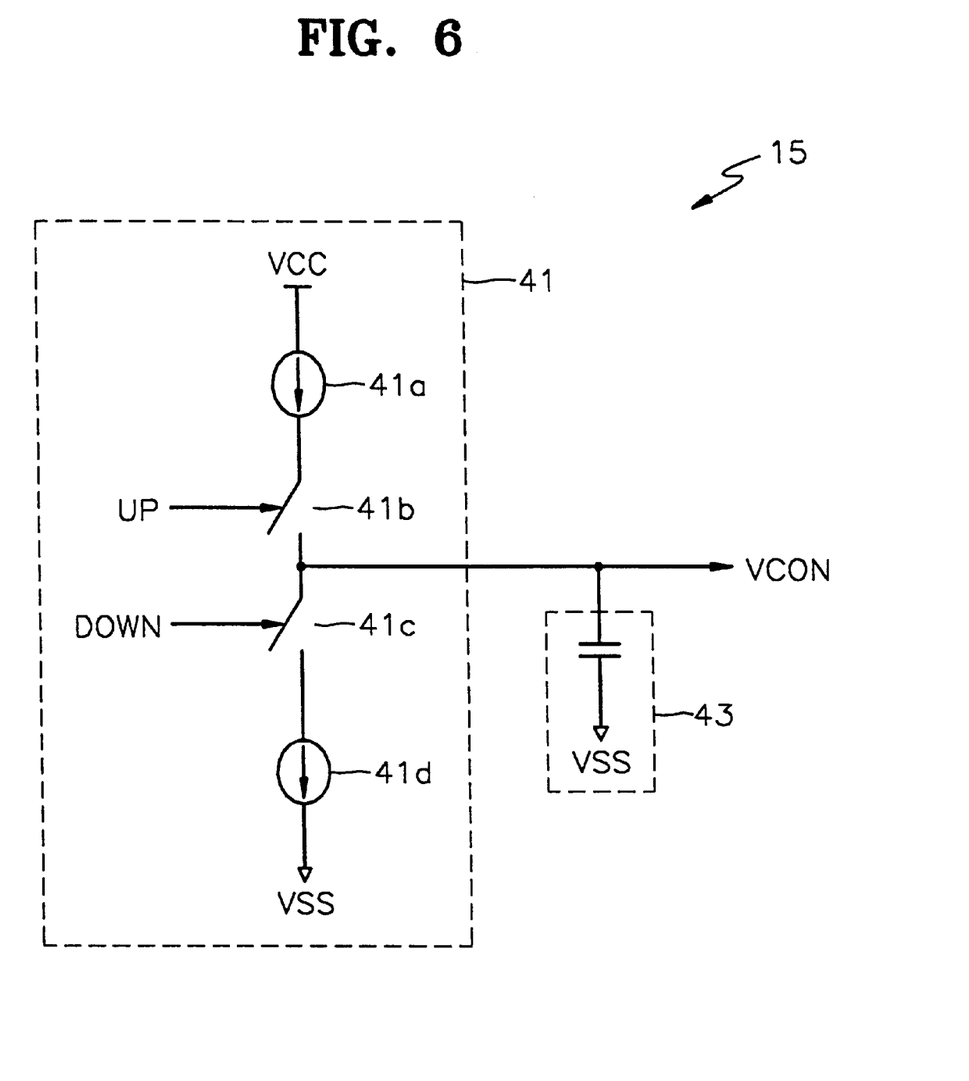
FIG. 6 is a schematic diagram illustrating a charge pump according to an embodiment of the present invention.

FIG. 6 illustrates a charge pump 15 according to an embodiment of the present invention, which receives the first and second phase comparison signals DOWN, UP and produces the delay control signal VCON responsively thereto. The charge pump 15 includes a charge control circuit 41 that charges and discharges a capacitor 43. The charge control circuit 41 includes a current source 41a that receives the power supply voltage VCC, supplying current to the capacitor 43 under control of a first switch 41b that is responsive to the second phase comparison signal UP. The charge control circuit also includes a current sink 41d that receives current from the capacitor 43 under control of a second switch 41c that is responsive to the first phase comparison signal DOWN, passing the current to a signal ground VSS.

Referring now to FIGS. 1 and 6, the charge pump 15 produces the delay control signal VCON responsive to the first and second phase comparison signals DOWN, UP, with the capacitor 43 (and associated resistances) acting as a low pass filter that filters switching transients associated with operation of the first and second switches 41b, 41c. When the duty cycle of the first phase comparison signal DOWN is greater than the duty cycle of the second phase comparison signal UP, indicating that the delayed clock signal DCLK is lagging the desired synchronization point, the second switch 41c is closed for a cumulatively longer time than the first switch 41b, causing the voltage of delay control signal VCON to decrease and thereby reduce the delay produced by the variable delay circuit 11. Conversely, if the duty cycle of the second phase comparison signal UP is greater than the duty cycle of the first phase comparison signal DOWN, indicating that the delayed clock signal DCLK is leading its desired synchronization point, the voltage of the delay control signal VCON increases, causing the delay introduced by the variable delay circuit 11 to increase.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A delay locked loop circuit, comprising:
   a variable delay circuit that receives an input clock signal and produces a delayed clock signal that is variably delayed with respect to the input clock signal responsive to a delay control signal applied to the variable delay circuit; and
   a delay control circuit, responsive to the input clock signal and to the delayed clock signal, that generates the delay control signal and applies the delay control signal to the variable delay circuit based on a comparison of a transition of the delayed clock signal corresponding to a first transition of the input clock signal to a second transition of the input clock signal that follows the first transition of the input clock signal.

2. A circuit according to claim 1, wherein said delay control circuit generates the delay control signal based on a comparison of an edge of the delayed clock signal corresponding to a first edge of the input clock signal to a second edge of the input clock signal that follows the first edge of the input clock signal; wherein the edge of the delayed clock signal is the transition of the delayed clock signal, the first edge of the input clock signal is the first transition of the input clock signal, and the second edge of the input clock signal is the second transition of the input clock signal.

3. A circuit according to claim 2, wherein said delay control circuit comprises:
 a phase comparator circuit that receives the input clock signal and the delayed clock signal and produces a phase comparison signal that indicates whether the edge of the delayed clock signal corresponding to the first edge of the input clock signal leads or lags the second edge of the input clock signal; and
 a delay control signal generating circuit that applies the delay control signal to said variable delay circuit responsive to the phase comparison signal.

4. A circuit according to claim 3, wherein said delay control signal generating circuit comprises a charge pump that generates the delay control signal responsive to the phase comparison signal.

5. A circuit according to claim 3:
 wherein said phase comparator circuit asserts a first phase comparison signal responsive to the edge of the delayed clock signal corresponding to the first edge of the input clock signal lagging the second edge of the input clock signal and asserts a second phase comparison signal responsive to the edge of the delayed clock signal corresponding to the first edge of the input clock signal leading the second edge of the input clock signal; and
 wherein said delay control signal generating circuit generates the delay control signal responsive to the first and second phase comparison signals.

6. A circuit according to claim 5, wherein said delay control signal generating circuit comprises a charge pump that generates the delay control signal responsive to the first and second phase comparison signals.

7. A circuit according to claim 6:
 wherein said variable delay circuit receives the delay control signal at a delay control signal input thereof;
 wherein said charge pump comprises:
  a capacitor coupled to said delay control signal input of said variable delay circuit;
  a current source;
  a current sink;
  a first switch operative to couple said current source to said capacitor when a first one of the first and second phase comparison signals is asserted; and
  a second switch operative to couple said current sink to said capacitor when a second one of the first and second phase comparison signals is asserted.

8. A circuit according to claim 5, wherein said phase comparator circuit asserts the second phase comparison signal for a time extending from the edge of the delayed clock signal corresponding to the first edge of the input clock signal to the second edge of the input clock signal if the edge of the delayed clock signal corresponding to the first edge of the input clock signal leads the second edge of the input clock signal, and wherein said phase comparator circuit asserts the first phase comparison signal for a time extending from the second edge of the input clock signal to the edge of the delayed clock signal corresponding to the first edge of the input clock signal if the edge of the delayed clock signal corresponding to the first edge of the input clock signal lags the second edge of the input clock signal.

9. A circuit according to claim 8, wherein said phase comparator circuit comprises:
 a first flip-flop having a data input, a clock input, a reset input and an output, said first flip-flop receiving the input clock signal at the clock input and a first data signal at the data input, clocking the first data signal to produce a second data signal at the output responsive to an edge of the input clock signal and resetting the second data signal responsive to an initialization signal at the reset input;
 a second flip-flop having a clock input, a data input, a reset input and an output, said second flip-flop receiving the delayed clock signal at the clock input, the first data signal at the input and clocking the first data signal to produce the second phase comparison signal at the output of the second flip-flop responsive to an edge of the delayed clock signal and resetting the second phase comparison signal responsive to a reset signal at the reset input;
 a third flip-flop having a clock input, a data input connected to the output of the first flip-flop, a reset input, and an output, said third flip-flop clocking the second data signal to produce the first phase comparison signal at the output of the third flip-flop responsive to an edge of the input clock signal and resetting the first phase comparison signal responsive to a reset signal at the reset input; and
 a reset circuit coupled to the outputs of the second and third flip-flops and operative to apply a reset signal to the reset inputs of the second and third flip flops responsive to at least one of the first and second phase comparison signals or the initialization signal.

10. A circuit according to claim 1, wherein said variable delay circuit comprises:
 a series-coupled plurality of inverters;
 a plurality of capacitors, each having a first node coupled to a signal ground; and
 a plurality of switches, a respective one of which is operative to variably couple a second node of a corresponding respective one of said plurality of capacitors to an output of a corresponding respective one of said plurality of inverters responsive to the delay control signal.

11. A method of producing a synchonized delayed signal from a periodic input signal, the method comprising the steps of:
 generating a delayed signal from the periodic input signal using a delay circuit;
 comparing a transition of the delayed signal corresponding to a first transition of the periodic input signal with a second transition of the periodic input signal that follows the first transition of the periodic input signal; and
 varying the delay introduced by the delay circuit based on the comparison of the transition of the delayed signal corresponding to the first transition of the periodic input signal with the second transition of the periodic input signal.

12. A method according to claim 11, wherein the periodic input signal comprises an input clock signal, wherein the delayed signal comprises a delayed clock signal, and wherein the transitions of the periodic input signal and the delayed signals comprise edges.

13. A method according to claim 12, wherein said step of varying comprises at least one of the steps of:

asserting a first phase comparison signal responsive to an edge of the delayed clock signal corresponding to a first edge of the input clock signal lagging a second edge of the input clock signal that follows the first edge of the input clock signal; or asserting a second phase comparison signal responsive to the edge of the delayed clock signal corresponding to the first edge of the input clock signal leading the second edge of the input clock signal; and wherein said step of varying further comprises the steps of:

generating a delay control signal responsive to the first and second phase comparison signals; and varying the delay of the delayed clock signal responsive to the delay control signal.

14. A method according to claim 13, wherein said first step of varying comprises at least one of the steps of:

asserting the second phase comparison signal for a time extending from the edge of the delayed clock signal corresponding to the first edge of the input clock signal to the second edge of the input clock signal responsive to the edge of the delayed clock signal corresponding to the first edge of the input clock signal leading the second edge of the input clock signal; or asserting the first phase comparison signal for a time extending from the second edge of the input clock signal to the edge of the delayed clock signal corresponding to the first edge of the input clock signal responsive to the edge of the delayed clock signal corresponding to the first edge of the input clock signal lagging the second edge of the input clock signal.

15. A delay locked loop circuit, comprising:

a variable delay circuit that receives an input clock signal and produces a delayed clock signal that is variably delayed with respect to the input clock signal responsive to a delay control signal applied to the variable delay circuit; and a delay control circuit directly coupled to the variable delay circuit, responsive to the input clock signal and to the delayed clock signal, that generates the delay control signal and applies the delay control signal to the variable delay circuit based on a comparison of a transition of the delayed clock signal corresponding to a first transition of the input clock signal to a second transition of the input clock signal that immediately follows the first transition of the input clock signal.

16. A circuit according to claim 15:

wherein said delay control circuit generates the delay control signal based on a comparison of an edge of the delayed clock signal corresponding to a first edge of the input clock signal to a second edge of the input clock signal that follows the first edge of the input clock signal;

wherein the edge of the delayed clock signal is the transition of the delayed clock signal, the first edge of the input clock signal is the first transition of the input clock signal, and the second edge of the input clock signal is the second transition of the input clock signal.

17. A circuit according to claim 16, wherein said delay control circuit comprises:

a phase comparator circuit that receives the input clock signal and the delayed clock signal and produces a phase comparison signal that indicates whether the edge of the delayed clock signal corresponding to the first edge of the input clock signal leads or lags the second edge of the input clock signal; and a delay control signal generating circuit that applies the delay control signal to said variable delay circuit responsive to the phase comparison signal.

18. A delay locked loop circuit, comprising:

a variable delay circuit that receives an input clock signal and produces a delayed clock signal at an output thereof that is variably delayed with respect to the input clock signal responsive to a delay control signal applied to the variable delay circuit; and a delay control circuit, directly coupled to the output of the variable delay circuit and responsive to the input clock signal and to the delayed clock signal, that generates the delay control signal and applies the delay control signal to the variable delay circuit based on a comparison of a transition of the delayed clock signal corresponding to a first transition of the input clock signal to a second transition of the input clock signal that follows the first transition of the input clock signal.

19. A circuit according to claim 18:

wherein said delay control circuit generates the delay control signal based on a comparison of an edge of the delayed clock signal corresponding to a first edge of the input clock signal to a second edge of the input clock signal that follows the first edge of the input clock signal;

wherein the edge of the delayed clock signal is the transition of the delayed clock signal, the first edge of the input clock signal is the first transition of the input clock signal, and the second edge of the input clock signal is the second transition of the input clock signal.

20. A circuit according to claim 19, wherein said delay control circuit comprises:

a phase comparator circuit that receives the input clock signal and the delayed clock signal and produces a phase comparison signal that indicates whether the edge of the delayed clock signal corresponding to the first edge of the input clock signal leads or lags the second edge of the input clock signal; and a delay control signal generating circuit that applies the delay control signal to said variable delay circuit responsive to the phase comparison signal.

* * * * *